United States Patent
Sonoda (10) Patent No.: US 11,387,110 B2
(45) Date of Patent: Jul. 12, 2022

(54) PLASMA PROCESSING APPARATUS AND PLASMA PROCESSING METHOD

(71) Applicant: HITACHI HIGH-TECH CORPORATION, Tokyo (JP)

(72) Inventor: Yasushi Sonoda, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 153 days.

(21) Appl. No.: 16/642,636

(22) PCT Filed: Jun. 20, 2019

(86) PCT No.: PCT/JP2019/024437
§ 371 (c)(1),
(2) Date: Feb. 27, 2020

(87) PCT Pub. No.: WO2020/012907
PCT Pub. Date: Jan. 16, 2020

(65) Prior Publication Data
US 2020/0402809 A1  Dec. 24, 2020

(51) Int. Cl.
*H01L 21/30* (2006.01)
*H01J 37/32* (2006.01)
(Continued)

(52) U.S. Cl.
CPC ...... *H01L 21/30655* (2013.01); *H01J 37/321* (2013.01); *H01J 37/32009* (2013.01);
(Continued)

(58) Field of Classification Search
CPC ......... H01L 21/30655; H01L 21/67069; H01L 21/3065; H01J 37/32009; H01J 37/321;
(Continued)

(56) References Cited

U.S. PATENT DOCUMENTS

| 4,579,623 A | 4/1986 | Suzuki et al. |
| 4,949,670 A | 8/1990 | Krogh |

(Continued)

FOREIGN PATENT DOCUMENTS

| JP | S60050923 A | 3/1985 |
| JP | H02105413 A | 4/1990 |

(Continued)

OTHER PUBLICATIONS

Office Action dated Jan. 20, 2016 for corresponding Korean Application No. 10-2015-0016544.
(Continued)

*Primary Examiner* — Vibol Tan
(74) *Attorney, Agent, or Firm* — Miles & Stockbridge, P.C.

(57) ABSTRACT

A plasma processing apparatus, including a processing; a first radio frequency power source; a sample stage on which the sample is placed; a second radio frequency power; and a control device configured to control, when the second radio frequency power source is controlled based on a change in a plasma impedance, which is generated when a first gas that is a gas for a first step is switched to a second gas that is a gas for a second step, such that the second radio frequency power is changed from a value of the second radio frequency power in the first step to a value of the second radio frequency power in the second step, and a supply time of the first gas such that a supply time of the second radio frequency power in the first step is substantially equal to a time of the first step.

12 Claims, 4 Drawing Sheets

(51) Int. Cl.
*H01L 21/3065* (2006.01)
*H01L 21/67* (2006.01)
(52) U.S. Cl.
CPC .. *H01J 37/32174* (2013.01); *H01J 37/32715* (2013.01); *H01L 21/67069* (2013.01); *H01J 2237/3343* (2013.01)
(58) Field of Classification Search
CPC ........... H01J 37/32174; H01J 37/32715; H01J 2237/3343; H01J 37/32449
See application file for complete search history.

(56) References Cited

U.S. PATENT DOCUMENTS

| | | | |
|---|---|---|---|
| 4,985,114 A | 1/1991 | Okudaira et al. | |
| 5,688,357 A | 11/1997 | Hanawa | |
| 6,265,831 B1 | 7/2001 | Howald et al. | |
| 10,043,636 B2* | 8/2018 | Kim | C23C 16/505 |
| 10,153,217 B2* | 12/2018 | Shiraishi | H01L 22/26 |
| 10,699,884 B2* | 6/2020 | Yamada | H01J 37/32082 |
| 10,699,909 B2* | 6/2020 | Sonoda | H01J 37/32311 |
| 10,804,077 B2* | 10/2020 | Iwao | H01J 37/244 |
| 10,903,047 B2* | 1/2021 | Ziemba | H01J 37/32146 |
| 11,107,664 B2* | 8/2021 | Kamaji | H01L 21/67069 |
| 11,257,661 B2* | 2/2022 | Ishiguro | H01J 37/32935 |
| 2005/0241763 A1 | 11/2005 | Huang et al. | |
| 2006/0037701 A1* | 2/2006 | Koshiishi | H01L 21/31116 156/345.44 |
| 2006/0220574 A1 | 10/2006 | Ogawa | |
| 2007/0066038 A1 | 3/2007 | Sadjadi et al. | |
| 2007/0116887 A1 | 5/2007 | Faguet | |
| 2007/0181254 A1 | 8/2007 | Iida | |
| 2010/0258529 A1 | 10/2010 | Mori et al. | |
| 2011/0234100 A1 | 9/2011 | Tomita et al. | |
| 2011/0281435 A1 | 11/2011 | Sadjadi et al. | |
| 2012/0038277 A1 | 2/2012 | Eto | |
| 2014/0203821 A1 | 7/2014 | Yamamoto | |
| 2014/0231389 A1 | 8/2014 | Nagami | |
| 2016/0133530 A1 | 5/2016 | Sonoda et al. | |
| 2017/0278676 A1 | 9/2017 | Nagami | |
| 2018/0190474 A1 | 7/2018 | Nagami | |

FOREIGN PATENT DOCUMENTS

| | | |
|---|---|---|
| JP | 2009521594 A | 6/2009 |
| JP | 2016092342 A | 5/2016 |
| JP | 2017174537 A | 9/2017 |
| KR | 20090082493 A | 7/2009 |
| WO | 2007061633 A2 | 5/2007 |
| WO | 2008061069 A1 | 5/2008 |

OTHER PUBLICATIONS

International Search Report w/Tranlsation dated Aug. 27, 2019, issued in PCT/JP2019/024437.

* cited by examiner

PLASMA PROCESSING APPARATUS AND PLASMA PROCESSING METHOD

TECHNICAL FIELD

The present invention relates to a plasma processing apparatus and a plasma processing method.

BACKGROUND ART

In a manufacturing process of a semiconductor device, there is a demand for miniaturization and integration of components included in the semiconductor device. For example, in an integrated circuit and a nanoelectronic mechanical system, a nanoscale structure is further promoted.

In the manufacturing process of the semiconductor device, a lithography technique is usually used to form a fine pattern. In this technique, a pattern of a device structure is applied on a resist layer, and a substrate exposed by the pattern on the resist layer is selectively etched and removed. In subsequent treatment processes, if another material is deposited in an etching region, the integrated circuit can be formed.

Incidentally, in an etching process of transferring a mask shape on a lower layer film, relatively higher shape controllability is required. For example, when etching a vertical shape having a high aspect ratio, an advanced technique is required. As one of such techniques, a gas pulse method for performing a plasma etching treatment is known, in which an etching gas and a deposition gas that forms a protective film having a high etching resistance against the etching gas are periodically and alternately introduced into a processing chamber while a plasma is generated.

For example, PTL 1 discloses that when the gases are alternately introduced, in order to enhance effect of each gas, a radio frequency power supplied to a sample stage is changed in synchronization with the introduction of the gas, such that a self-bias is generated in a process of introducing the etching gas and a process of introducing the deposition gas.

When an etching treatment is performed while alternately performing etching and forming the protective film by using the gas pulse method, a minute step shape referred to as scalloping is formed on a side surface of a processed hole after the etching, but this minute step shape is undesirable when forming the semiconductor device. In order to prevent this minute step shape, it is effective to shorten an introduction time of the gases to be alternately introduced to one to three seconds.

An amount of the gases introduced into the processing chamber is generally controlled by giving a control signal for introducing a desired gas flow rate to a gas supply device, such as a mass flow controller (MFC). However, during a time period from a time when the flow rate signal is given to the gas supply device to a time when the gas is introduced into the processing chamber, a delay about 1 second is generated by influences such as a response time of the gas supply device, or pressure and a gas flow in the processing chamber, gas pipes and a shower plate. Further, the delay has a variation of about 0.2 to 0.3 seconds.

Therefore, when a gas introduction time is about 1 to 3 seconds, it is necessary to perform control in consideration of a delay that is from when the control signal is given to the gas supply device to when the gas is actually introduced into the processing chamber. This is because if such control is not performed, a time gap that cannot be ignored is generated between a timing of introducing the gas of a process for etching or forming the protective film in the processing chamber and a timing of controlling process parameters such as a bias and a power for generating the plasma to values suitable for each process, so that optimal treatment will not be implemented.

In addition, in order to reduce the influence of variations in the delay time of gas introduction, it is necessary to control other process parameters while grasping an accurate time of introducing the gas into the processing chamber in real time.

A method for determining exchange of the etching gas and the deposition gas is disclosed in PTL 2, in which by detecting a gas ratio using an emission spectrum and a mass spectrometer, a switching time between the introduction of the etching gas and the deposition gas is obtained and the radio frequency power is synchronized.

In addition, a method as described in PTL 3 is known, in which after detecting a switch from one gas to the other gas based on a change in plasma impedance, the radio frequency power source is controlled to change the radio frequency power supplied from the radio frequency power source.

CITATION LIST

Patent Literature

PTL 1: JP-A-S60-50923
PTL 2: JP-A-H2-105413
PTL 3: JP-A-2016-92342

SUMMARY OF INVENTION

Technical Problem

However, in the related art, a problem of machine differences that occur between a plurality of plasma processing apparatuses is not been sufficiently considered. Specifically, in the methods disclosed in PTL 2 and PTL 3, since the radio frequency power is changed based on the switching of introduction of the gases, a time during which the etching gas or the deposition gas, or the like flows in the processing chamber becomes a time during which the radio frequency power corresponding to each gas is applied.

A gas supply system configured with the gas supply device and the like is less responsive than the radio frequency power source, and as a result, a difference in responsiveness between the gas supply systems of a plurality of devices is also larger than a difference in responsiveness between the radio frequency power sources of the plurality of devices. However, since an applying time of the radio frequency power is determined by the time during which the gas flows through the processing chamber, a machine difference in the responsiveness of the gas supply systems appears as a machine difference in the applying time of the radio frequency power between the plurality of plasma processing apparatuses. As a result, there is a problem that a machine difference larger than a machine difference in the applying time that has occurred due to the machine difference in responsiveness of the radio frequency power source occurs between the plasma processing apparatuses, and the treatment time varies and mass production stability is reduced.

As described above, in view of the above problems, an object of the invention is to provide a plasma processing apparatus and a plasma processing method with which plasma etching can be performed with high shape controllability and a small machine difference in the applying time of radio frequency power among a plurality of plasma processing apparatuses that perform plasma processing while periodically switching gases.

Solution to Problem

In order to solve above problems, a representative plasma processing apparatus according to the invention is provided. The plasma processing apparatus includes:

a processing chamber in which a sample is subjected to plasma processing;

a first radio frequency power source configured to supply a first radio frequency power for generating a plasma;

a sample stage on which the sample is placed;

a second radio frequency power source configured to supply a second radio frequency power to the sample stage; and a control device configured to control, when the first radio frequency power source is controlled based on a change in a plasma impedance, which is generated when a first gas that is a gas for a first step is switched to a second gas that is a gas for a second step, such that the first radio frequency power is changed from a value of the first radio frequency power in the first step to a value of the first radio frequency power in the second step, a supply time of the first gas by using a first time and a second time such that a supply time of the first radio frequency power in the first step is substantially equal to a time of the first step, in which the first step and the second step are steps of plasma processing conditions, the first time is a time period from a start time of the first step to a start time of a supply of the first gas, and the second time is a time period from a finish time of the first step to a finish time of the supply of the first gas.

Further, a representative plasma processing apparatus according to the invention is provided. The plasma processing apparatus includes:

a processing chamber in which a sample is subjected to plasma processing;

a first radio frequency power source configured to supply a first radio frequency power for generating a plasma;

a sample stage on which the sample is placed;

a second radio frequency power source configured to supply a second radio frequency power to the sample stage; and a control device configured to control, when the second radio frequency power source is controlled based on a change in a plasma impedance, which is generated when a first gas that is a gas for a first step is switched to a second gas that is a gas for a second step, such that the second radio frequency power is changed from a value of the second radio frequency power in the first step to a value of the second radio frequency power in the second step, a supply time of the first gas by using a first time and a second time such that a supply time of the second radio frequency power in the first step is substantially equal to a time of the first step, in which the first step and the second step are steps of plasma processing conditions, the first time is a time period from a start time of the first step to a start time of a supply of the first gas, and the second time is a time period from a finish time of the first step to a finish time of the supply of the first gas.

Further, a representative plasma processing apparatus according to the invention is provided. The plasma processing apparatus includes:

a processing chamber in which a sample is subjected to plasma processing;

a first radio frequency power source configured to supply a first radio frequency power for generating a plasma;

a sample stage on which the sample is placed;

a second radio frequency power source configured to supply a second radio frequency power to the sample stage; and a control device configured to control, when the first radio frequency power source is controlled based on a change in a plasma impedance, which is generated when a first gas that is a gas for a first step is switched to a second gas that is a gas for a second step, such that the first radio frequency power is changed from a value of the first radio frequency power in the first step to a value of the first radio frequency power in the second step, a supply time of the second gas by using a first time and a second time such that a supply time of the first radio frequency power in the second step is substantially equal to a time of the second step, in which the first step and the second step are steps of plasma processing conditions, the first time is a time period from a start time of the first step to a start time of a supply of the first gas, and the second time is a time period from a finish time of the first step to a finish time of the supply of the first gas.

Further, a representative plasma processing apparatus according to the invention is provided. The plasma processing apparatus includes:

a processing chamber in which a sample is subjected to plasma processing;

a first radio frequency power source configured to supply a first radio frequency power for generating a plasma;

a sample stage on which the sample is placed;

a second radio frequency power source configured to supply a second radio frequency power to the sample stage; and a control device configured to control, when the second radio frequency power source is controlled based on a change in a plasma impedance, which is generated when a first gas that is a gas for a first step is switched to a second gas that is a gas for a second step, such that the second radio frequency power is changed from a value of the second radio frequency power in the first step to a value of the second radio frequency power in the second step, a supply time of the second gas by using a first time and a second time such that a supply time of the second radio frequency power in the second step is substantially equal to a time of the second step, in which the first step and the second step are steps of plasma processing conditions, the first time is a time period from a start time of the first step to a start time of a supply of the first gas, and the second time is a time period from a finish time of the first step to a finish time of the supply of the first gas.

Further, a representative plasma processing method in which a plasma processing apparatus is used according to the invention is provided.

The plasma processing apparatus includes:

a processing chamber in which a sample is subjected to plasma processing;

a first radio frequency power source configured to supply a first radio frequency power for generating a plasma;

a sample stage on which the sample is placed; and a second radio frequency power source configured to supply a second radio frequency power to the sample stage.

The plasma processing method includes:

controlling, when the first radio frequency power source is controlled based on a change in a plasma impedance, which is generated when a first gas that is a gas for a first step is switched to a second gas that is a gas for a second step, such that the first radio frequency power is changed from a value of the first radio frequency power in the first step to a value of the first radio frequency power in the second step, a supply time of the first gas by using a first time and a second time such that a supply time of the first radio frequency power in the first step is substantially equal to a time of the first step, in which the first step and the second step are steps of plasma processing conditions, the first time is a time period from a start time of the first step to a start time of a supply of the first gas, and the second time is a time period from a finish time of the first step to a finish time of the supply of the first gas.

Further, a representative plasma processing method in which a plasma processing apparatus is used according to the invention is provided.

The plasma processing apparatus includes:

a processing chamber in which a sample is subjected to plasma processing;

a first radio frequency power source configured to supply a first radio frequency power for generating a plasma;

a sample stage on which the sample is placed; and a second radio frequency power source configured to supply a second radio frequency power to the sample stage.

The plasma processing method includes:

controlling, when the second radio frequency power source is controlled based on a change in a plasma impedance, which is generated when a first gas that is a gas for a first step is switched to a second gas that is a gas for a second step, such that the second radio frequency power is changed from a value of the second radio frequency power in the first step to a value of the second radio frequency power in the second step, a supply time of the first gas by using a first time and a second time such that a supply time of the second radio frequency power in the first step is substantially equal to a time of the first step, in which the first step and the second step are steps of plasma processing conditions, the first time is a time period from a start time of the first step to a start time of a supply of the first gas, and the second time is a time period from a finish time of the first step to a finish time of the supply of the first gas.

Further, a representative plasma processing method in which a plasma processing apparatus is used according to the invention is provided.

The plasma processing apparatus includes:

a processing chamber in which a sample is subjected to plasma processing;

a first radio frequency power source configured to supply a first radio frequency power for generating a plasma;

a sample stage on which the sample is placed; and a second radio frequency power source configured to supply a second radio frequency power to the sample stage.

The plasma processing method includes:

controlling, when the first radio frequency power source is controlled based on a change in a plasma impedance, which is generated when a first gas that is a gas for a first step is switched to a second gas that is a gas for a second step, such that the first radio frequency power is changed from a value of the first radio frequency power in the first step to a value of the first radio frequency power in the second step, a supply time of the second gas by using a first time and a second time such that a supply time of the first radio frequency power in the second step is substantially equal to a time of the second step, in which the first step and the second step are steps of plasma processing conditions, the first time is a time period from a start time of the first step to a start time of a supply of the first gas, and the second time is a time period from a finish time of the first step to a finish time of the supply of the first gas.

Further, a representative plasma processing method in which a plasma processing apparatus is used according to the invention is provided.

The plasma processing apparatus includes:

a processing chamber in which a sample is subjected to plasma processing;

a first radio frequency power source configured to supply a first radio frequency power for generating a plasma;

a sample stage on which the sample is placed; and a second radio frequency power source configured to supply a second radio frequency power to the sample stage.

The plasma processing method includes:

controlling, when the second radio frequency power source is controlled based on a change in a plasma impedance, which is generated when a first gas that is a gas for a first step is switched to a second gas that is a gas for a second step, such that the second radio frequency power is changed from a value of the second radio frequency power in the first step to a value of the second radio frequency power in the second step, a supply time of the second gas by using a first time and a second time such that a supply time of the second radio frequency power in the second step is substantially equal to a time of the second step, in which the first step and the second step are steps of plasma processing conditions, the first time is a time period from a start time of the first step to a start time of a supply of the first gas, and the second time is a time period from a finish time of the first step to a finish time of the supply of the first gas.

Advantageous Effect

According to the invention, the plasma processing apparatus and the plasma processing method with which the plasma etching can be performed with high shape controllability and a small machine difference in the applying time of radio frequency power among a plurality of plasma processing apparatuses that perform plasma processing while periodically switching gases.

Problems, configurations, and effects other than those described above will be clarified by the following description of embodiments.

DESCRIPTION OF EMBODIMENTS

Figure 1:
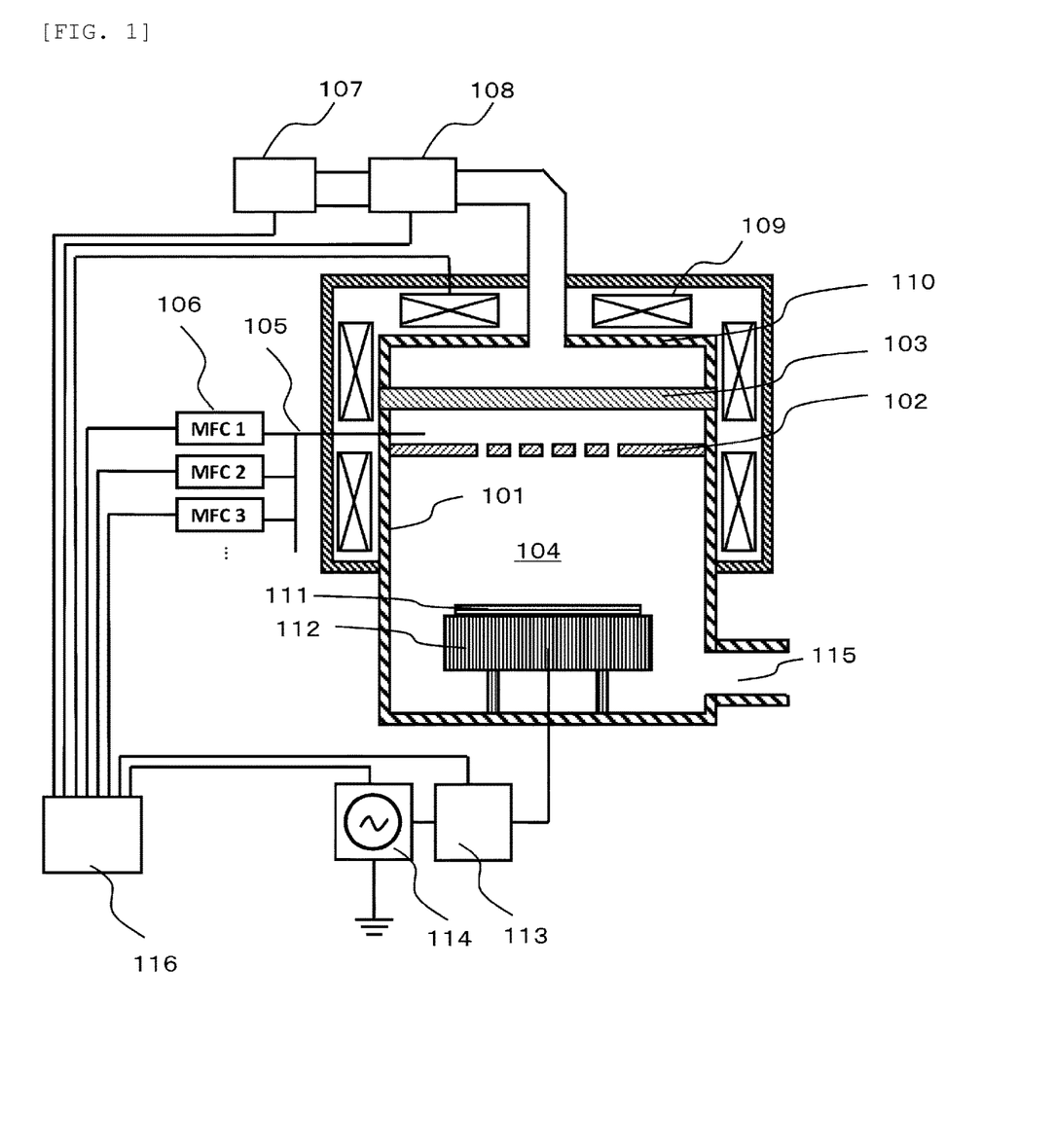
FIG. 1 is a longitudinal sectional view illustrating a configuration of a plasma processing apparatus according to an embodiment of the invention.

Hereinafter, an embodiment of the invention is described with reference to the drawings. FIG. 1 is a longitudinal sectional view illustrating an outline of an overall configuration of a plasma processing apparatus according to the present embodiment of the invention. A shower plate 102 for introducing an etching gas into a vacuum vessel 101 and a dielectric window 103 for air tightly sealing an upper portion of a processing chamber are disposed on an upper portion of the vacuum vessel 101 to constitute a processing chamber 104. A plurality of gas supply devices (MFC) 106 are connected to the shower plate 102 via a gas pipe 105, and each gas supply device 106 is respectively connected to a source (not illustrated) of a treatment gas, such as $SF_6$ gas, $O_2$ gas, or the like, for performing a plasma etching treatment.

A first process gas (etching gas) for performing an etching treatment with the plurality of gas supply devices and a second process gas (deposition gas) for performing a protective film forming treatment can be alternately introduced into the processing chamber 104 via the gas pipe 105 and the shower plate 102 at a constant cycle. Here, the first process gas constitutes a first step gas, that is, a first gas, and the second process gas constitutes a second step gas, that is, a second gas.

The etching gas and the deposition gas may be a single gas or a combination of a plurality of gases. In order to reduce discharge instability during gas switching, it is desirable to add a rare gas that does not significantly change characteristics of each process, such as Ar gas and He gas, into the etching gas and deposition gas as a common gas. Further, it is assumed that a vacuum exhaust device (not illustrated) is connected to the vacuum vessel 101 via a vacuum exhaust port 115, such that pressure in the processing chamber 104 can be controlled.

A plasma generation mechanism in this plasma processing apparatus is configured with an electromagnetic wave generation power source (magnetron) 107 that generates 2.45 GHz electromagnetic waves referred to as microwaves, a microwave matching unit 108 and a magnetic field generation coil 109. The plasma generation mechanism generates plasma in the processing chamber 104 by an electron cyclotron resonance (ECR) between an electromagnetic wave (first radio frequency power) oscillated from the electromagnetic wave generation power source 107 which is a first radio frequency power source and a magnetic field formed by the magnetic field generation coil 109.

In addition, a sample stage 112 on which a semiconductor substrate 111 that is a sample to be processed is placed is disposed at a lower portion of the processing chamber 104 facing the shower plate 102. A radio frequency power source 114 which is a second radio frequency power source is connected to the sample stage 112 via a radio frequency matching unit 113.

By supplying a radio frequency power (second radio frequency power) from the radio frequency power source 114 connected to the sample stage 112, a negative voltage generally called a self-bias is generated on the sample stage 112, and ions in the plasma are accelerated by the self-bias and vertically incident on the semiconductor substrate 111, so that the semiconductor substrate 111 is etched.

A control device 116 controls these devices described above based on predetermined process conditions. In addition, the control device 116 introduces the gas into the processing chamber 104 by the method described below. The method includes: receiving data related to plasma impedance from the microwave matching unit 108 or the radio frequency matching unit 113, detecting whether the gas is introduced into the processing chamber 104, and controlling a timing that changes process parameters other than the gas after the detection. Examples of such process parameter changes include a change of the first radio frequency power between a first value corresponding to a first step and a second value corresponding to a second step, and a change of the second radio frequency power between the first value corresponding to the first step and the second value corresponding to the second step.

Figure 2:
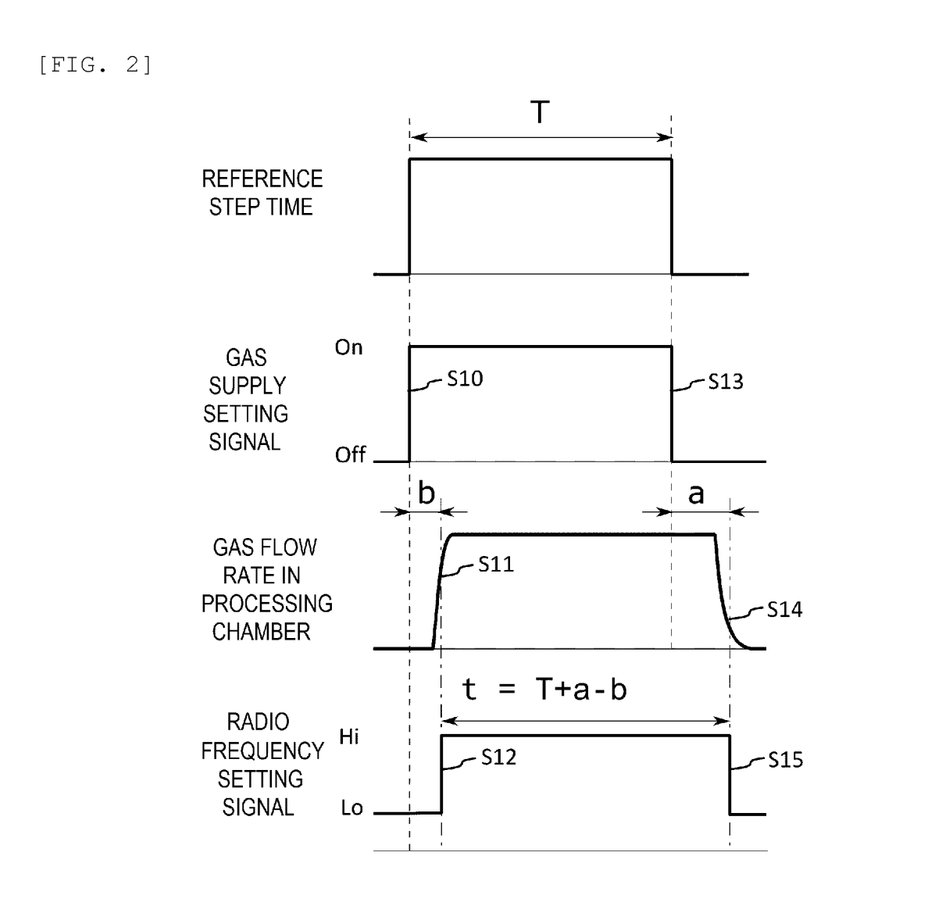
FIG. 2 is a diagram illustrating that a radio frequency applying time fluctuates when a radio frequency power is changed in synchronization with gas switching.

FIG. 2 illustrates that when the second radio frequency power is changed in synchronization with the gas switching, how an applying time t of the second radio frequency power fluctuates with respect to a reference step time T according to a time period from a gas supply setting (S10) until the gas is introduced into the processing chamber 104 (S11).

In the following control, "a state where the gas supply setting signal is on" means that the control device 116 outputs a gas supply setting signal that instructs a gas supply to the gas supply device 106, and "a state where the gas supply setting signal is off" means that the control device 116 cuts off the output of the gas supply setting signal to the gas supply device 106.

The gas supply setting signal transmitted from the control device 116 to the gas supply device 106 is changed between being turned on and turned off, so as to be in synchronization with the reference step time. Firstly, a gas flow rate, which is introduced into the processing chamber 104 when the state where the gas supply setting signal is on (S10) is set, increases later than the state where the gas supply setting signal is on (S10) due to a delay in response to the setting signal of the gas supply device 106, and a time required for passing through the gas pipes 105 and the shower plate 102.

After it is detected that a desired gas is flowed into the processing chamber 104 (S11), a radio frequency setting signal transmitted to the radio frequency power source 114 is enabled to be changed from Low to High (S12) in accordance with the predetermined process conditions, and the second radio frequency power is changed from the first value to the second value. Accordingly, it is assumed that a time b is elapsed from the state where the gas supply setting signal is on (S10) to a state where the radio frequency setting signal is changed (S12). The time b is set as a first time from a start time of the step to a start time of the gas supply.

Further, in the state where the gas supply setting signal is off (S13) after the time T is elapsed from the state where the gas supply setting signal is on (S10), a delay in gas reduction occurs. Specifically, the gas is discharged from an inside of the processing chamber 104 later than the state where the gas supply setting signal is off (S13) due to the delay in response to the setting signal of the gas supply device 106 and a time required for discharging the gas which is filled in the gas pipes 105 and the shower plate 102.

After it is detected that the desired gas is discharged from the inside of the processing chamber 104 (S14), the radio frequency setting signal is enabled to be changed from High to Low (S15) in accordance with the predetermined process conditions. Accordingly, it is assumed that a time a is elapsed from the state where the gas supply setting signal is off (S13) to a state where the radio frequency setting signal is changed (S15). The time a is set as a second time from a finish time of the step to a finish time of the gas supply.

The time b from the state where the gas supply setting signal is on (S10) to a state where the gas is introduced into the processing chamber 104 and the time a from the state where the gas supply setting signal is off (S13) to a state where the gas is discharged from the processing chamber 104 vary depending on characteristics such as the gas flow rate and gas viscosity of a target step and characteristics such as the gas flow rate and gas viscosity of steps before and after the target step. In addition, when gas conditions are different in the steps before and after the target step, the times a and b are not equal.

The radio frequency setting signal rises after the time b with respect to a reference start time and then lasts for a time longer than a reference finish time by the time a, so that a time t set for the second radio frequency power of the target step becomes (T+a−b), which is different from the reference step time by a time difference (a−b).

The time difference (a−b) is a numerical value that varies depending on responsiveness of the gas supply device 106, and the time difference (a−b) varies depending on a machine difference in the gas supply device of each plasma processing apparatus. As a result, the time t=(T+a−b) during which the second radio frequency power is applied also changes. Since the time during which the second radio frequency power is applied greatly influences a result of plasma processing performed on the semiconductor substrate, a treatment result of the semiconductor substrate between the plasma processing apparatuses varies depending on the machine difference in the gas supply device.

In order to reduce the machine difference between the plasma devices in the second radio frequency power applying time t generated due to the machine difference in the gas supply device, a time during which the gas of the target step flows in the processing chamber 104 that determines the application time of the second radio frequency power is necessary to be corrected by the time difference (a−b) in order to counterbalance the fluctuation caused by the time difference (a−b). In order to change the time during which the gas flows, a gas supply time which is set as a basis of the gas supply may be changed from T to {T−(a−b)}. By setting the gas supply time to {T−(a−b)}, the applying time t of the second radio frequency power becomes t=T−(a−b)+(a−b)=T and can include no time difference (a−b), and becomes a time that does not include the machine difference in the gas supply device, and the like.

However, since the time a from the state where the gas supply setting signal is off to the state where the target gas is discharged from the processing chamber 104 can be known only after the gas supply setting signal is actually off and the radio frequency setting signal is changed, it is necessary to measure the time a before adjustment. In a gas pulse method, since one cycle including a plurality of steps is repeated a plurality of times, the control device 116 may change the gas supply time of a target cycle by using a time measured in an immediately preceding cycle.

Figure 3:
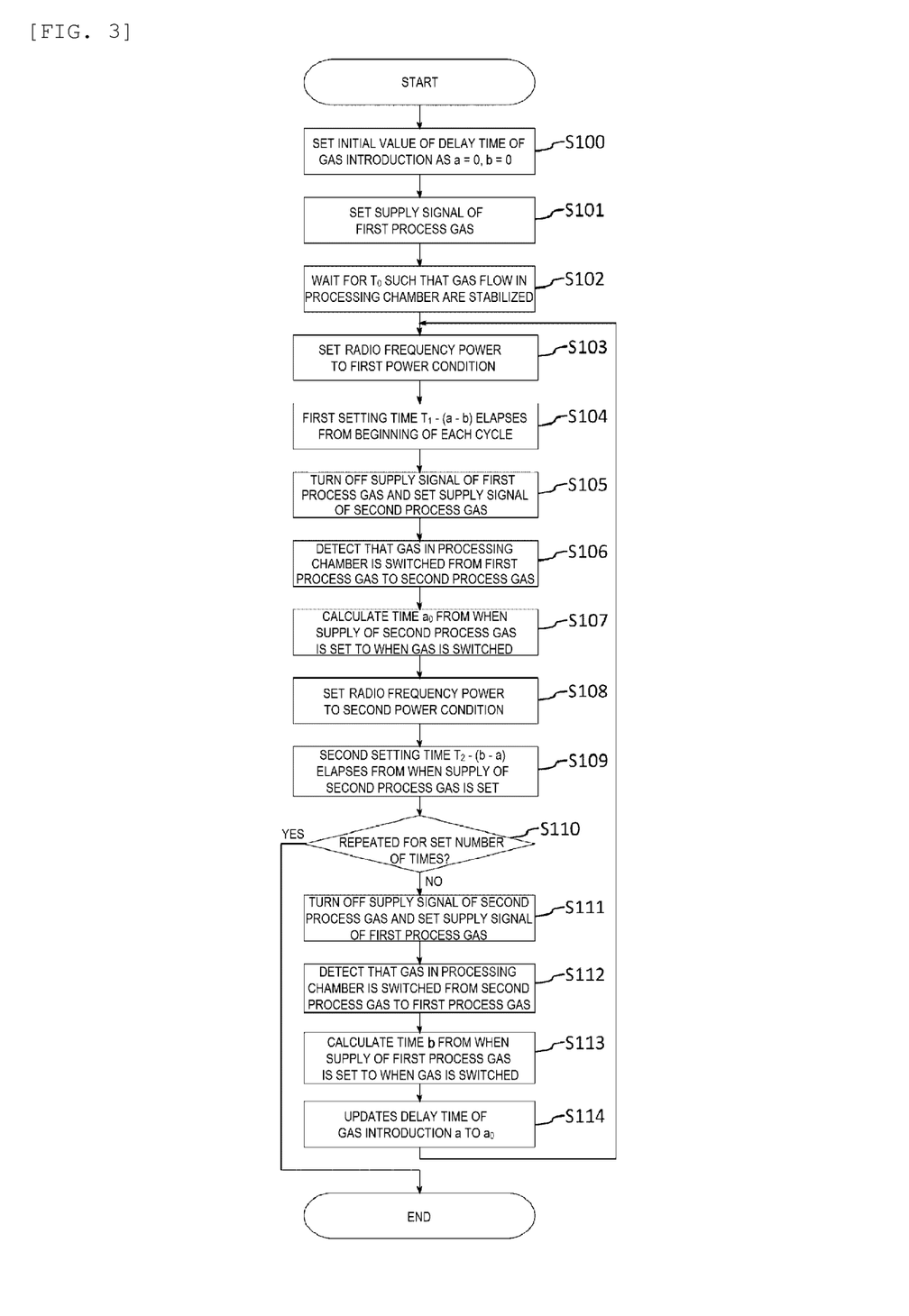
FIG. 3 is a flowchart illustrating operations in which a setting time of a gas supply setting signal transmitted to a gas supply device according to the embodiment of the invention is changed based on a delay time from when a supply is set to when a gas is introduced into a processing chamber.
Figure 4:
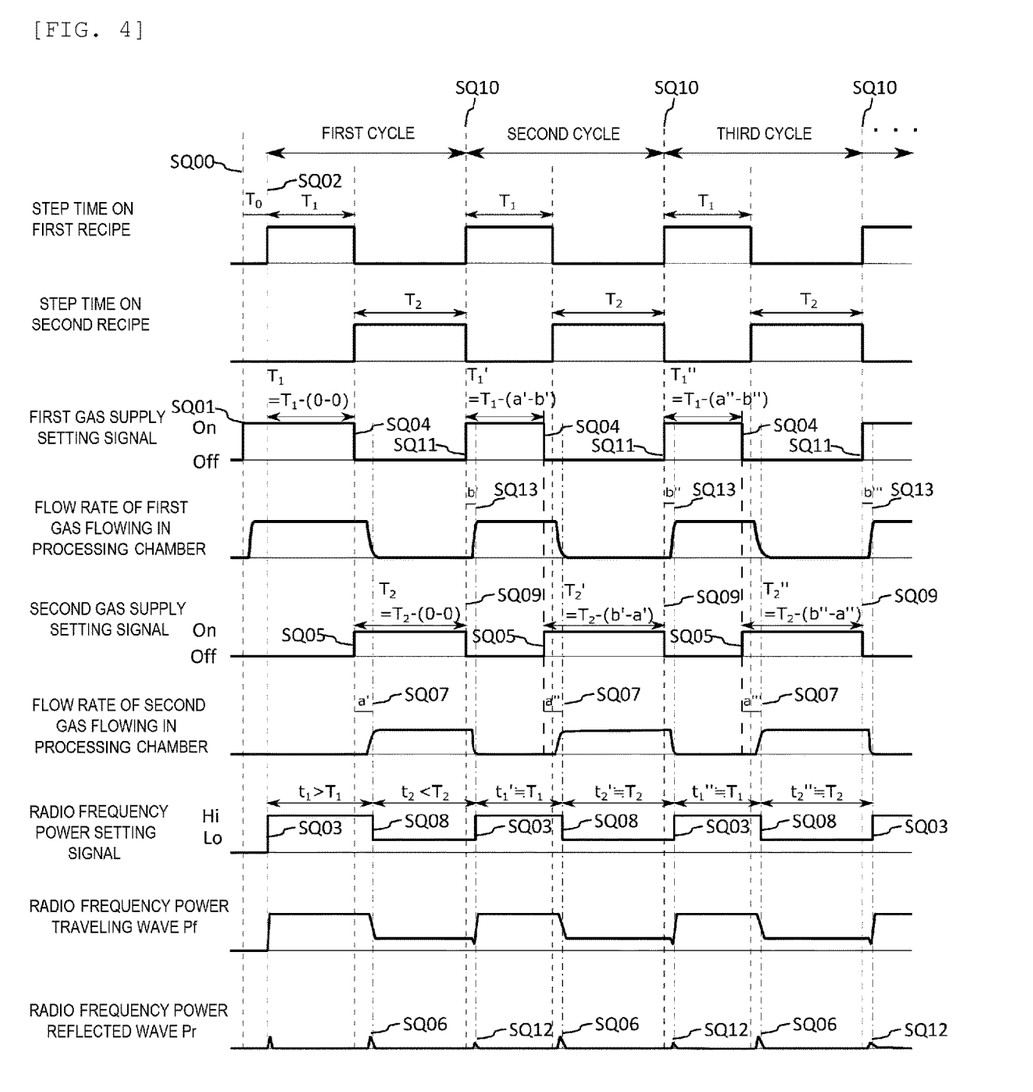
FIG. 4 is a timing chart when the setting time of the gas supply setting signal transmitted to the gas supply device is adjusted according to the flowchart of FIG. 3.

FIG. 3 is a flowchart in a case of controlling the gas supply device 106 and the radio frequency matching unit 113 in the plasma processing method by the gas pulse method in which the treatment including two steps in the above method is repeated. FIG. 4 is a timing chart when the gas supply device and the radio frequency power source are controlled based on the flowchart.

At a start of the operations of the plasma processing apparatus (SQ00 in FIG. 4), since a time from the state of the gas supply setting signal is on until the gas is introduced into the processing chamber 104 is not measured yet, in step S100 in FIG. 3, the time a of the second gas introduction delay and the time b of the first gas introduction delay are set to an initial value 0, respectively.

In the gas pulse method, when a supply of one gas (first gas) is stopped, a supply of the other gas (the second gas different from the first gas) is started simultaneously. However, after the gas supply setting is switched, if one gas filled in the gas pipe 105 is not pushed out by the other gas, the one gas is not discharged and the other gas is not introduced. Therefore, it is assumed that the time a of the second gas introduction delay is from a state where the first gas supply setting signal is off (S13 in FIG. 2) to a state where the first gas is discharged (S14 in FIG. 2). Similarly, it is assumed that the time b of the first gas introduction delay is from a state where the second gas supply setting signal is off to a state where the second gas is discharged.

Next, in step S101, the control device 116 transmits a first gas supply setting signal to the gas supply device 106 so as to firstly supply the first process gas (SQ01 in FIG. 4), and in step S102, the control device 116 waits for awaiting time $T_0$ until gas flow and pressure in the processing chamber 104 are stabilized. The first step is started from SQ02 in FIG. 4

In step S103, the control device 116 generates the plasma by the electromagnetic wave generation power source 107 supplying a microwave for plasma generation to the processing chamber while the magnetic field generation coils 109 generating a magnetic field. Further, the control device 116 supplies a radio frequency power corresponding to a value of the second radio frequency power in the first step to the sample stage 112 by the radio frequency power source 114, and then, the etching treatment is started by controlling each part of the device to a first process parameter, such as generating the self-bias (SQ03 in FIG. 4).

In step S104, the control device 116 waits for a time obtained by subtracting the time difference (a−b) from a first step time $T_1$ to be a reference, and then turns off a first process gas supply setting signal in step S105 (SQ04 in FIG. 4), and meanwhile, a second process gas supply setting signal is turned on (SQ05 in FIG. 4). The first step finishes at SQ04 in FIG. 4, and the second step starts at SQ05 in FIG. 4. Since a preceding cycle does not exist at a first cycle, a=b=0, and a time for turning on the gas supply setting signal remains $T_1$, but after a second cycle, the time for turning on the gas supply setting signal can be changed by using the times a and b obtained in a previous cycle.

After that, with the process proceeding from the first step to the second step, the plasma impedance changes when the gas in the processing chamber switches from the first process gas to the second process gas, and therefore, a matching point of the second radio frequency power also changes, and a reflected wave of the second radio frequency power is generated (SQ06 in FIG. 4). In step S106, the control device 116 detects that the gas in the processing chamber 104 is switched from the first process gas to the second process gas by using information of the reflected wave (SQ07 in FIG. 4).

Next, in step S107, the control device 116 calculates a time $a_0$ from when the second process gas supply setting signal is turned on (SQ05 in FIG. 4) to when the gas in the processing chamber is switched to the second process gas (SQ07 in FIG. 4), and in step S108, the second radio frequency power is set by the radio frequency power source 114 (SQ08 in FIG. 4). In other words, the control device 116 controls the radio frequency power source 114 so as to change the value of the second radio frequency power in the first step to the value of the second radio frequency power in the second step. Here, the time from step S105 to step S106 is set to $a_0$ instead of a, that is because a is not updated until a next cycle is proceeded. When proceeding to the next cycle, the control device 116 substitutes $a_0$ for time a to replace a (step S114 to be described later).

Since the introduction delay time and the discharge delay time of the second process gas are opposite to those of the first process gas, the control device 116 waits for a time obtained by subtracting the time difference (b−a) from a second step time $T_2$ to be a reference in step S109. In other words, the control device 116 controls a supply time of the second process gas, so that the supply time of the second process gas becomes the time obtained by subtracting the predetermined value (b−a) from the second step time $T_2$. Since step S109 is an end of one cycle (SQ10 in FIG. 4), the control device 116 determines whether or not the number of times set in step S110 is repeated, and when the set number of times is not repeated, the control device 116 proceeds to the next cycle.

Since the control device 116 supplies the second process gas for a time {$T_2$−(b−a)} in step S109, in step S111 which is the next cycle, the second process gas supply setting signal is turned off (SQ09 in FIG. 4), and meanwhile, the first process gas supply setting signal is turned on (SQ11 in FIG. 4). When the gas in the processing chamber 104 is switched from the second process gas to the first process gas, a reflected wave of the second radio frequency power is generated similarly as in step S106 (SQ12 in FIG. 4), so that the control device 116 detects that the gas is switched in step S112 based on this information.

Next, in step S113, a time b from when the first process gas supply setting signal is turned on (S111 in FIG. 4) to when the gas in the processing chamber 104 is switched to the first process gas (SQ13 in FIG. 4) is calculated.

As a result, since both the time $a_0$ during which the first process gas is switched to the second process gas and the time b during which the second process gas is switched to the first process gas are obtained, the control device 116 updates the time a to $a_0$ in step S114, and the flow returns to step S103 and proceeds to the treatment of setting the second radio frequency power to a value corresponding to the first step again for the next cycle. At this time, the control device 116 controls a supply time of the first process gas, so that the supply time of the first process gas becomes the time obtained by subtracting the predetermined value (b−a) from the first step time $T_1$.

Thereafter, the etching treatment is continued in the gas pulse method until it is determined in step S110 that a determined treatment number of times is reached, and when it is determined that the number is reached, the etching treatment is finished. According to the present embodiment, as apparently illustrated in FIG. 4, in the first cycle, the first step time $T_1$ is different from the time $t_1$ for applying the second radio frequency power according to the first step, and the second step time $T_2$ is different from the time $t_2$ for applying the second radio frequency power according to the second step. However, by executing the above steps, $T_1 \approx t_1$ and $T_2 \approx t_2$ can be achieved in the second and subsequent cycles.

In other words, the control device 116 can control a supply time of the first process gas by using the time a and the time b, so that the supply time of the second radio frequency power in the first step is substantially equal to the time of the first step, and can control a supply time of the second process gas by using the time a and the time b, so that the supply time of the second radio frequency power in the second step is substantially equal to the time of the second step.

The control device 116 controls the electromagnetic wave generation power source 107 so as to change the value of the first radio frequency power in the first step to the value of the first radio frequency power in the second step. In this case, the control device 116 can control a supply time of the first process gas by using the time a and the time b, so that the supply time of the first radio frequency power in the first step is substantially equal to the time of the first step, and can control a supply time of the second process gas by using the time a and the time b, so that the supply time of the first radio frequency power in the second step is substantially equal to the time of the second step.

Since the time of gas introduction delay measured in the previous cycle is used, it is impossible to completely equalize the applying times $t_1$, $t_2$ of the second radio frequency power and the step times $T_1$, $T_2$ to be the references. However, since even the time of gas introduction delay in the previous cycle is a time that includes the machine difference in the gas supply device, it is possible to reduce the machine difference in the applying time of the second radio frequency power between a plurality of plasma processing apparatuses by changing a setting time of the gas supply by using this time.

FIG. 3 and FIG. 4 are applied when the treatment is repeated with one cycle including two steps, but the invention can also be applied even when the number of steps constituting one cycle is three or more.

There may be a case where a detection of an end point of the gas switching is not executed in a part between the steps of the cycle constituted by a plurality of steps. In order to apply the invention even in that case, the gas delay time is calculated between the steps of the detection of the end point of the gas switching and changing the second radio frequency power, the gas delay time between the steps of changing the second radio frequency power without the detection of the end point is regarded as 0, and the gas supply time may be adjusted.

In the present embodiment, the gas switching in the processing chamber is detected based on the change in the plasma impedance, and the time from when the gas supply setting signal is turned on to when the gas is supplied to the processing chamber is calculated. However, by a method for detecting gas switching in the processing chamber using a change in emission spectrum intensity from plasma in addition to this and a method in which a particle measuring instrument is installed in the processing chamber to detect gas switching by analyzing gas molecules in the processing chamber, the time from when the gas supply setting signal is turned on to the time when the gas is supplied to the processing chamber can also be calculated.

The invention is not limited to the above embodiment, and includes various modifications. For example, an inductively coupled plasma (ICP) treatment device, a capacitively coupled plasma (CCP) treatment device, and the like may be used, so that the invention can be applied to switch the second radio frequency power after the switching of gas in the processing chamber is detected.

Further, the embodiment described above have been described in detail for easy understanding of the invention, and the invention is not necessarily limited to those including all the configurations described above, so various changes can be made without departing from the scope of the invention.

REFERENCE SIGN LIST

101: Vacuum vessel
102: Shower plate
103: Dielectric window
104: Processing chamber
105: Gas pipe
106: Gas supply device
107: Electromagnetic wave generation power source
108: Microwave matching unit
109: Magnetic field generation coil
110: Cavity resonator
111: Semiconductor substrate
112: Sample stage
113: Radio frequency matching unit
114: Radio frequency power source
115: Vacuum exhaust port
116: Control device

The invention claimed is:

1. A plasma processing apparatus, comprising:
a processing chamber in which a sample is subjected to plasma processing;
a first radio frequency power source configured to supply a first radio frequency power for generating a plasma;
a sample stage on which the sample is placed;
a second radio frequency power source configured to supply a second radio frequency power to the sample stage; and
a control device configured to control, when the first radio frequency power source is controlled based on a change in a plasma impedance, which is generated when a first gas that is a gas for a first step is switched to a second gas that is a gas for a second step, such that the first radio frequency power is changed from a value of the first radio frequency power in the first step to a value of the first radio frequency power in the second step, a supply time of the first gas by using a first time and a second time such that a supply time of the first radio frequency power in the first step is substantially equal to a time of the first step, wherein
the first step and the second step are steps of plasma processing conditions,
the first time is a time period from a start time of the first step to a start time of a supply of the first gas, and
the second time is a time period from a finish time of the first step to a finish time of the supply of the first gas.

2. A plasma processing apparatus, comprising:
a processing chamber in which a sample is subjected to plasma processing;
a first radio frequency power source configured to supply a first radio frequency power for generating a plasma;
a sample stage on which the sample is placed;
a second radio frequency power source configured to supply a second radio frequency power to the sample stage; and
a control device configured to control, when the second radio frequency power source is controlled based on a change in a plasma impedance, which is generated when a first gas that is a gas for a first step is switched to a second gas that is a gas for a second step, such that the second radio frequency power is changed from a value of the second radio frequency power in the first step to a value of the second radio frequency power in the second step, a supply time of the first gas by using a first time and a second time such that a supply time of the second radio frequency power in the first step is substantially equal to a time of the first step, wherein
the first step and the second step are steps of plasma processing conditions,
the first time is a time period from a start time of the first step to a start time of a supply of the first gas, and
the second time is a time period from a finish time of the first step to a finish time of the supply of the first gas.

3. The plasma processing apparatus according to claim 1, wherein
the control device controls the supply time of the first gas such that the supply time of the first gas is a time obtained by subtracting a predetermined value from the time of the first step, and
the predetermined value is a value obtained by subtracting the first time from the second time.

4. A plasma processing apparatus, comprising:
a processing chamber in which a sample is subjected to plasma processing;
a first radio frequency power source configured to supply a first radio frequency power for generating a plasma;
a sample stage on which the sample is placed;
a second radio frequency power source configured to supply a second radio frequency power to the sample stage; and
a control device configured to control, when the first radio frequency power source is controlled based on a change in a plasma impedance, which is generated when a first gas that is a gas for a first step is switched to a second gas that is a gas for a second step, such that the first radio frequency power is changed from a value of the first radio frequency power in the first step to a value of the first radio frequency power in the second step, a supply time of the second gas by using a first time and a second time such that a supply time of the first radio frequency power in the second step is substantially equal to a time of the second step, wherein
the first step and the second step are steps of plasma processing conditions,
the first time is a time period from a start time of the first step to a start time of a supply of the first gas, and
the second time is a time period from a finish time of the first step to a finish time of the supply of the first gas.

5. A plasma processing apparatus, comprising:
a processing chamber in which a sample is subjected to plasma processing;
a first radio frequency power source configured to supply a first radio frequency power for generating a plasma;
a sample stage on which the sample is placed;
a second radio frequency power source configured to supply a second radio frequency power to the sample stage; and
a control device configured to control, when the second radio frequency power source is controlled based on a change in a plasma impedance, which is generated when a first gas that is a gas for a first step is switched to a second gas that is a gas for a second step, such that the second radio frequency power is changed from a value of the second radio frequency power in the first step to a value of the second radio frequency power in the second step, a supply time of the second gas by using a first time and a second time such that a supply time of the second radio frequency power in the second step is substantially equal to a time of the second step, wherein
the first step and the second step are steps of plasma processing conditions,
the first time is a time period from a start time of the first step to a start time of a supply of the first gas, and the second time is a time period from a finish time of the first step to a finish time of the supply of the first gas.

6. The plasma processing apparatus according to claim 4, wherein
the control device controls the supply time of the second gas such that the supply time of the second gas is a time obtained by subtracting a predetermined value from the time of the second step, and
the predetermined value is a value obtained by subtracting the second time from the first time.

7. A plasma processing method in which a plasma processing apparatus is used,
the plasma processing apparatus including:
a processing chamber in which a sample is subjected to plasma processing;
a first radio frequency power source configured to supply a first radio frequency power for generating a plasma;
a sample stage on which the sample is placed; and
a second radio frequency power source configured to supply a second radio frequency power to the sample stage,
the plasma processing method comprising:
controlling, when the first radio frequency power source is controlled based on a change in a plasma impedance, which is generated when a first gas that is a gas for a first step is switched to a second gas that is a gas for a second step, such that the first radio frequency power is changed from a value of the first radio frequency power in the first step to a value of the first radio frequency power in the second step, a supply time of the first gas by using a first time and a second time such that a supply time of the first radio frequency power in the first step is substantially equal to a time of the first step, wherein
the first step and the second step are steps of plasma processing conditions,
the first time is a time period from a start time of the first step to a start time of a supply of the first gas, and
the second time is a time period from a finish time of the first step to a finish time of the supply of the first gas.

8. A plasma processing method in which a plasma processing apparatus is used,
the plasma processing apparatus including:
a processing chamber in which a sample is subjected to plasma processing;
a first radio frequency power source configured to supply a first radio frequency power for generating a plasma;
a sample stage on which the sample is placed; and
a second radio frequency power source configured to supply a second radio frequency power to the sample stage,
the plasma processing method comprising:
controlling, when the second radio frequency power source is controlled based on a change in a plasma impedance, which is generated when a first gas that is a gas for a first step is switched to a second gas that is a gas for a second step, such that the second radio frequency power is changed from a value of the second radio frequency power in the first step to a value of the second radio frequency power in the second step, a supply time of the first gas by using a first time and a second time such that a supply time of the second radio frequency power in the first step is substantially equal to a time of the first step, wherein
the first step and the second step are steps of plasma processing conditions,
the first time is a time period from a start time of the first step to a start time of a supply of the first gas, and
the second time is a time period from a finish time of the first step to a finish time of the supply of the first gas.

9. A plasma processing method in which a plasma processing apparatus is used,
the plasma processing apparatus including:
a processing chamber in which a sample is subjected to plasma processing;
a first radio frequency power source configured to supply a first radio frequency power for generating a plasma;
a sample stage on which the sample is placed; and
a second radio frequency power source configured to supply a second radio frequency power to the sample stage,
the plasma processing method comprising:
controlling, when the first radio frequency power source is controlled based on a change in a plasma impedance, which is generated when a first gas that is a gas for a first step is switched to a second gas that is a gas for a second step, such that the first radio frequency power is changed from a value of the first radio frequency power in the first step to a value of the first radio frequency power in the second step, a supply time of the second gas by using a first time and a second time such that a supply time of the first radio frequency power in the second step is substantially equal to a time of the second step, wherein
the first step and the second step are steps of plasma processing conditions,
the first time is a time period from a start time of the first step to a start time of a supply of the first gas, and
the second time is a time period from a finish time of the first step to a finish time of the supply of the first gas.

10. A plasma processing method in which a plasma processing apparatus is used,
the plasma processing apparatus including:
a processing chamber in which a sample is subjected to plasma processing;
a first radio frequency power source configured to supply a first radio frequency power for generating a plasma;
a sample stage on which the sample is placed; and
a second radio frequency power source configured to supply a second radio frequency power to the sample stage,
the plasma processing method comprising:
controlling, when the second radio frequency power source is controlled based on a change in a plasma impedance, which is generated when a first gas that is a gas for a first step is switched to a second gas that is a gas for a second step, such that the second radio frequency power is changed from a value of the second radio frequency power in the first step to a value of the second radio frequency power in the second step, a supply time of the second gas by using a first time and a second time such that a supply time of the second radio frequency power in the second step is substantially equal to a time of the second step, wherein
the first step and the second step are steps of plasma processing conditions,
the first time is a time period from a start time of the first step to a start time of a supply of the first gas, and
the second time is a time period from a finish time of the first step to a finish time of the supply of the first gas.

11. The plasma processing apparatus according to claim 2, wherein
the control device controls the supply time of the first gas such that the supply time of the first gas is a time obtained by subtracting a predetermined value from the time of the first step, and
the predetermined value is a value obtained by subtracting the first time from the second time.

12. The plasma processing apparatus according to claim 5, wherein
the control device controls the supply time of the second gas such that the supply time of the second gas is a time obtained by subtracting a predetermined value from the time of the second step, and
the predetermined value is a value obtained by subtracting the second time from the first time.

* * * * *